(12) United States Patent
Furukawa et al.

(10) Patent No.: US 7,348,610 B2
(45) Date of Patent: Mar. 25, 2008

(54) MULTIPLE LAYER AND CRYSTAL PLANE ORIENTATION SEMICONDUCTOR SUBSTRATE

(75) Inventors: Toshiharu Furukawa, Essex Junction, VT (US); David V. Horak, Essex Junction, VT (US); Charles W. Koburger, III, Delmar, NY (US); Leathen Shi, III, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,557

(22) Filed: Feb. 24, 2005

(65) Prior Publication Data

US 2006/0186416 A1   Aug. 24, 2006

(51) Int. Cl.
*H01L 27/10* (2006.01)

(52) U.S. Cl. .................. 257/203; 257/204; 257/205; 257/E27.105; 257/E27.11

(58) Field of Classification Search ............ 438/150, 438/199; 257/E21.088, 203–205, E27.105, 257/E27.11
See application file for complete search history.

(56) References Cited

U.S. PATENT DOCUMENTS

| | | | |
|---|---|---|---|
| 5,459,340 A * | 10/1995 | Anderson et al. ........... 257/203 |
| 6,245,615 B1 | 6/2001 | Noble et al. |
| 6,333,208 B1 * | 12/2001 | Li ............................. 438/107 |
| 6,335,231 B1 * | 1/2002 | Yamazaki et al. .......... 438/151 |
| 6,379,998 B1 | 4/2002 | Ohta et al. |
| 6,483,171 B1 | 11/2002 | Forbes et al. |
| 6,657,259 B2 | 12/2003 | Fried et al. |
| 6,911,379 B2 * | 6/2005 | Yeo et al. ................... 438/480 |
| 2001/0026006 A1 | 10/2001 | Noble et al. |
| 2005/0121676 A1 * | 6/2005 | Fried et al. .................. 257/72 |
| 2005/0181549 A1 * | 8/2005 | Barr et al. .................. 438/150 |
| 2005/0202600 A1 * | 9/2005 | Yamashita .................. 438/149 |
| 2005/0280121 A1 * | 12/2005 | Doris et al. ................ 257/629 |

\* cited by examiner

*Primary Examiner*—Zandra V. Smith
*Assistant Examiner*—Tsz K Chiu
(74) *Attorney, Agent, or Firm*—Schmeiser, Olsen & Watts; William D. Sabo

(57) ABSTRACT

A semiconductor on insulator substrate and a method of fabricating the substrate. The substrate including: a first crystalline semiconductor layer and a second crystalline semiconductor layer; and an insulating layer bonding a bottom surface of the first crystalline semiconductor layer to a top surface of the second crystalline semiconductor layer, a first crystal direction of the first crystalline semiconductor layer aligned relative to a second crystal direction of the second crystalline semiconductor layer, the first crystal direction different from the second crystal direction.

11 Claims, 5 Drawing Sheets

MULTIPLE LAYER AND CRYSTAL PLANE ORIENTATION SEMICONDUCTOR SUBSTRATE

FIELD OF THE INVENTION

The present invention relates to the field of semiconductor substrates; more specifically, it relates a method of fabricating a semiconductor substrate having multiple crystalline layers with different crystal plane orientations.

BACKGROUND OF THE INVENTION

In advanced semiconductor devices, individual devices such as transistors are positioned on semiconductor substrates relative to the crystal orientation of the substrate in order to take advantage of the fact that certain device parameters change based on the alignment of device structures relative to the crystal planes of the substrate. However, this often leads to integrated circuit chip edges that are no longer aligned to preferred crystal cleavage planes of the substrate, making dicing of the substrate into individual integrated circuit chips difficult and often resulting in wafer breakage. What is needed is a semiconductor substrate and a method of fabricating the substrate that allows device structures that take advantage of particular crystal plane alignments that at the same time can be easily diced into individual integrated circuit chips.

SUMMARY OF THE INVENTION

A semiconductor substrate of the present invention comprises an insulating layer between an upper semiconductor layer and a lower semiconductor layer. A first crystal direction in the upper layer is rotationally displaced from a second crystal direction in the lower semiconductor layer. The edges of integrated circuit chips formed in the upper semiconductor layer are aligned to the second crystal direction to enhance dicing while some or all of devices formed in the integrated circuit chips have structures aligned to the first crystal direction.

A first aspect of the present invention is a substrate, comprising: a first crystalline semiconductor layer and a second crystalline semiconductor layer; and an insulating layer bonding a bottom surface of the first crystalline semiconductor layer to a top surface of the second crystalline semiconductor layer, a first crystal direction of the first crystalline semiconductor layer aligned relative to a second crystal direction of the second crystalline semiconductor layer, the first crystal direction different from the second crystal direction.

A second aspect of the present invention is a method of fabricating a substrate, comprising: providing a first crystalline semiconductor substrate, providing a second crystalline semiconductor substrate; aligning a first crystal direction of the first crystalline semiconductor substrate to a second crystal direction of the second crystalline semiconductor substrate, the first crystal direction different from the second crystal direction; and forming an insulating layer between a bottom surface of the first crystalline semiconductor substrate and a top surface of the second crystalline semiconductor substrate, the insulating layer bonding the first crystalline semiconductor substrate to the second crystalline semiconductor substrate.

A third aspect of the present invention is an integrated circuit chip, comprising: a first crystalline semiconductor layer and a second crystalline semiconductor layer; an insulating layer bonding a bottom surface of the first crystalline semiconductor layer to a top surface of the second crystalline semiconductor layer, a first crystal direction of the first crystalline semiconductor layer aligned relative to a second crystal direction of the second crystalline semiconductor layer, the first crystal direction different from the second crystal direction; a field effect transistor comprising a source region, a drain region and a channel region separating the source and drain regions, the source, drain and a channel regions formed in the first crystalline semiconductor layer, a lengthwise direction of the channel extending between the source and drain regions aligned with both the first and the second directions; and at least one edge of the integrated circuit chip aligned with the second direction.

A fourth aspect of the present invention is a method of fabricating an integrated circuit chip, comprising: providing a semiconductor-on-insulator substrate comprising a first crystalline semiconductor layer and a second crystalline semiconductor layer, a first crystal direction of the first crystalline semiconductor substrate aligned relative to a second crystal direction of the second crystalline semiconductor substrate, the first crystal direction different from the second crystal direction, an insulating layer formed between a bottom surface of the first crystalline semiconductor substrate and a top surface of the second crystalline semiconductor substrate, the insulating layer bonding the first crystalline semiconductor substrate to the second crystalline semiconductor; forming a field effect transistor comprising a source region, a drain region and a channel region separating the source and drain regions, the source, drain and a channel regions formed in the first crystalline semiconductor layer, a lengthwise direction of the channel extending between the source and drain regions aligned with both the first and the second directions; and dicing the semiconductor-on-insulator substrate along the second direction to form at least one edge of the integrated circuit chip.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, the term wafer should be considered as and exemplary version of the more general term substrate.

In crystalline solids, the atoms which make up the solid are spatially arranged in a periodic fashion called a lattice. A crystal lattice contains a volume, which is representative of the entire lattice and is regularly repeated throughout the crystal. In describing crystalline semiconductor materials in the present disclosure, the following conventions will be used:

The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, crystal directions in the cubic lattice [100], [010] and [001] are all crystallographically equivalent. A direction and all its equivalent directions are denoted by < > brackets. Thus, the designation of the <10022 direction includes the equivalent [100], [010] and [001] positive directions as well as the equivalent negative directions [−100], [0-10] and [00-1].

Planes in a crystal may also be identified with a set of three integers. They are used to define a set of parallel planes and each set of integers enclosed in ( ) parentheses identifies a specific plane. For example the proper designation for a crystal plane perpendicular to the [100] direction is (100). Thus, if either a direction or a plane of a cubic lattice is known, its perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0-10) and (00-1).

Figure 1:
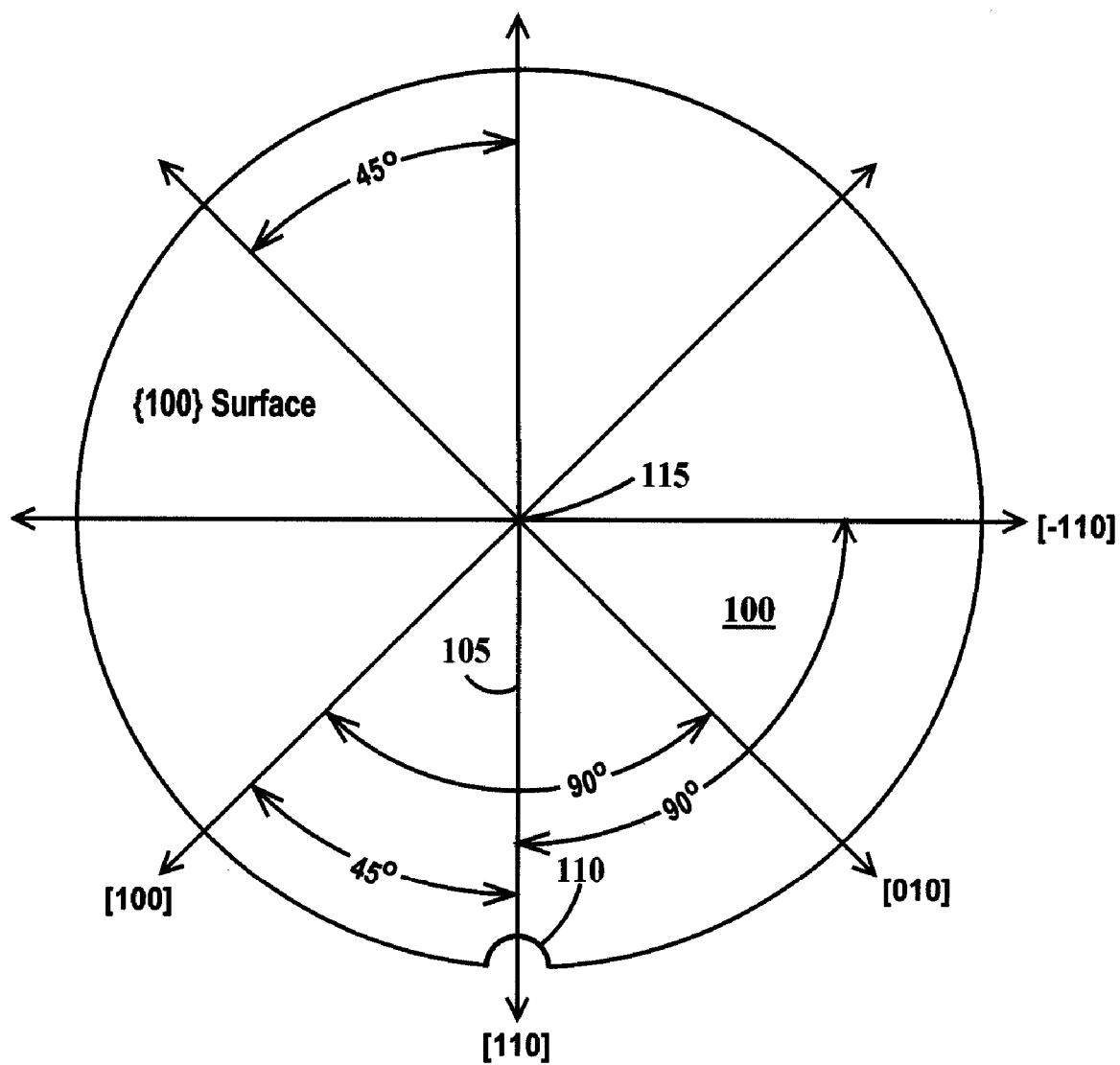
FIG. 1 is a top view of an exemplary {100} surfaced semiconductor substrate.

FIG. 1 is a top view of an exemplary {100} surfaced semiconductor substrate. In FIG. 1, a [100] direction of a {100} silicon substrate 100 is seen to be rotated 45° from a [110] crystal direction. A [010] crystal direction is seen to be rotated 90° from the [100] crystal direction and 45° from the [110] crystal direction. A [−110] crystal direction is seen to be rotated 90° from the [110] crystal direction. A line 105 passing through a notch 110 in the edge of substrate 100 and a center 115 of the substrate marks the [110] direction. Inversion carrier flow is affected by the crystal orientation of the channel of a field effect transistor (FET). For {100} surfaced substrates the mobility of the electrons (inversion carriers) in the channels of NFETs is relatively unaffected by choice of channel direction between the <100> crystal directions and the <110> crystal directions. The mobility of holes (inversion carriers) in the channels of PFETs is highest in <100> crystal directions and significantly lower in <110> directions.

In one method of dicing silicon wafers, a dicing saw is used to scribe a line into the silicon wafer between integrated chips and then the wafer cleaved along these scribed lines. In another method, the dicing saw is used to cut completely through the silicon wafer. However, crystalline silicon wafers have a preferred cleavage planes and are most easily and cleanly broken or cut along {110} crystal planes.

Figure 2:
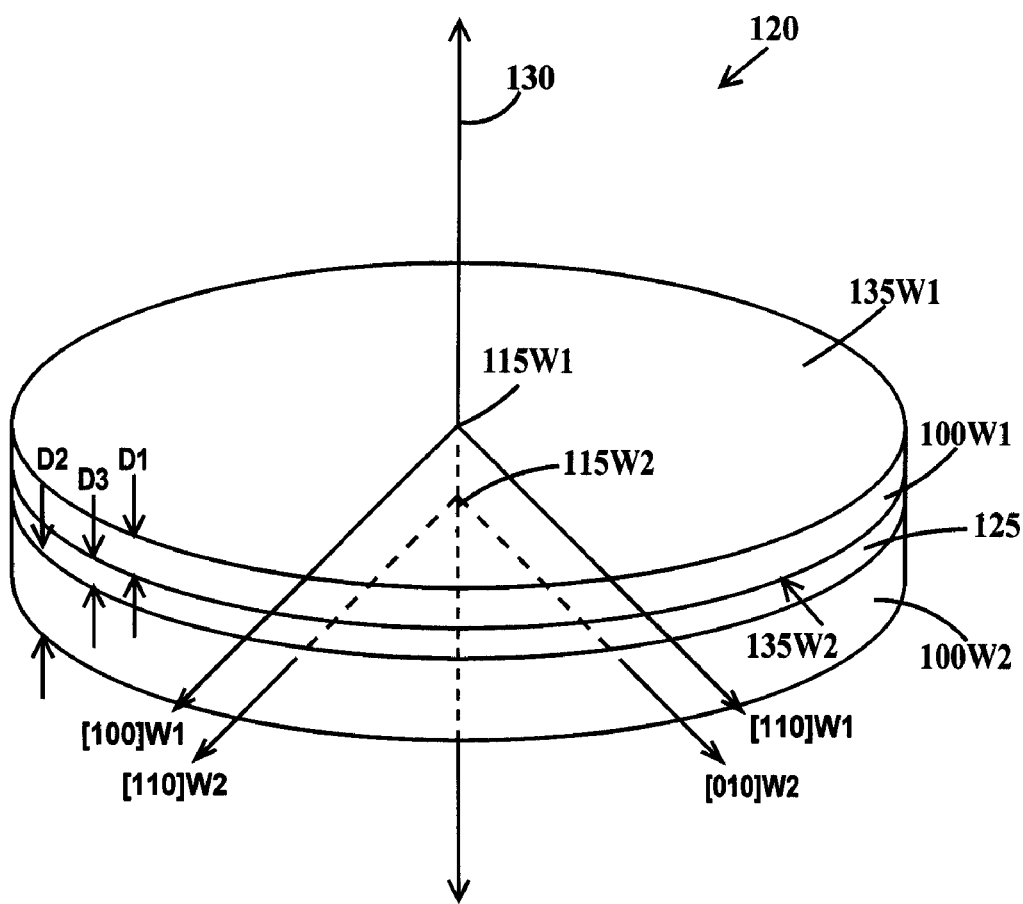
FIG. 2 illustrates an exemplary semiconductor substrate according to the present invention.

FIG. 2 illustrates an exemplary semiconductor substrate 120 according to the present invention. In FIG. 2, a {100} crystalline silicon layer 100W1 is bonded to a {100} crystalline silicon layer 100W2 by an insulating layer 125. A central vertical axis 130 is perpendicular to top surfaces 135W1 and 135W2 of silicon layers 100W1 and 100W2 respectively. Top surface 135W1 is also the top surface of semiconductor substrate 120. Semiconductor devices, such as transistors, are intended to be formed in silicon layer 100W1 and/or on top surface 135W1.

Vertical axis 130 passes through centers 115W1 and 115W2 of respective silicon layers 100W1 and 100W2. The [100] and [110] crystal directions of silicon layer 100W1 are designated as [100]W1 and [110]W1 respectively. The [010] and [110] crystal directions of silicon layer 100W2 are designated as [100]W2 and [110]W2 respectively. Crystal direction [100]W1 is aligned to crystal direction [110]W2 and crystal direction [110]W1 is aligned to crystal direction [010]W2 Another way of stating the relation ship between the crystal directions of silicon layers 100W1 and 100W2 is that (a first) crystal direction [100]W1 is rotated 45° about axis 130 relative to (a second) crystal direction [100]W2.

The particular crystal plane alignment illustrated in FIG. 2 and described supra, should be considered exemplary and many variations are possible. For example, instead of two different crystal directions (for example, the [100] and [110] crystal directions) in two different silicon layers being aligned, the same crystal directions (for example, the [100] and [100] crystal directions) in the two different silicon layers may be rotationally offset from one another by a pre-selected angle of rotation about a vertical axis running through the centers of both wafers. Additionally, different orientation silicon layers may be used. For example silicon layer 100W1 may be a {111} crystalline silicon layer and silicon layer 100W2 may be a {100} crystalline silicon layer. Further, one or both of silicon layers 100W1 and 100W2 may be replaced with a layer comprising a group III-V semiconductor material such as GaAs, GaP, GaSb, InP, In As, InSb First silicon layer 100W1 has a thickness D1, second silicon layer 100W2 has a thickness D2 and insulating layer 125 has a thickness D3. In one example, D1 is between about 10 nm and about 100 nm, D2 is greater than about 700 microns and D3 is between about 5 nm and about 1000 nm, preferably between 50 nm and 250 nm. In one example, insulating layer 125 comprises silicon oxide.

Figure 3A:
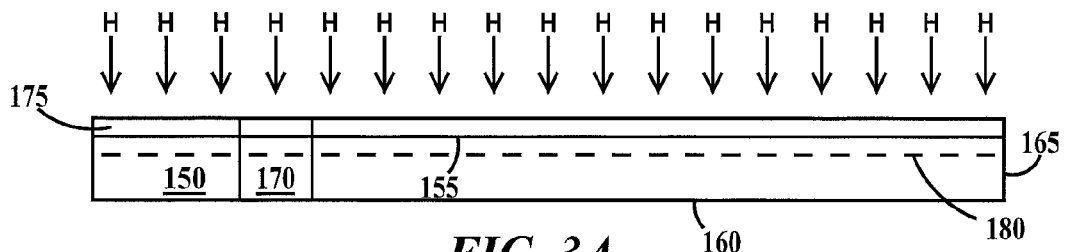
FIGS. 3A through 3E are side views of the fabrication of an exemplary semiconductor substrate according to the present invention.

FIGS. 3A through 3E are side views of the fabrication of an exemplary semiconductor substrate according to the present invention. In FIG. 3A, a first silicon wafer 150 has a top surface 155, a bottom surface 160 and an edge 165. A notch 170 is formed in wafer 150. A silicon dioxide layer 175 having a thickness between about 0.5 nm to about 200 nm is formed on top surface 155 of wafer 150. A hydrogen ion implantation performed to form a hydrogen rich layer 180 in wafer 150.

Figure 3B:
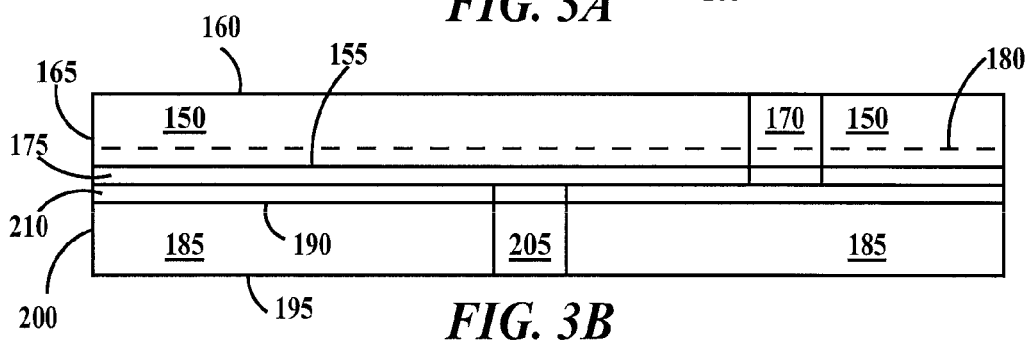

In FIG. 3B, a second silicon wafer 185 has a top surface 190, a bottom surface 195 and an edge 200. A notch 205 is formed in wafer 185. A silicon dioxide layer 210 having a thickness between about 0.5 nm to about 200 nm is formed on top surface 190 of wafer 185. Oxide layers 175 and 210 are cleaned, edges 165 and 200 are aligned oxide layers 175 and 200 are Drought into contact. Notches 170 and 205 serve to locate particular crystal planes in respective wafers 150 and 185.

Figure 3C:
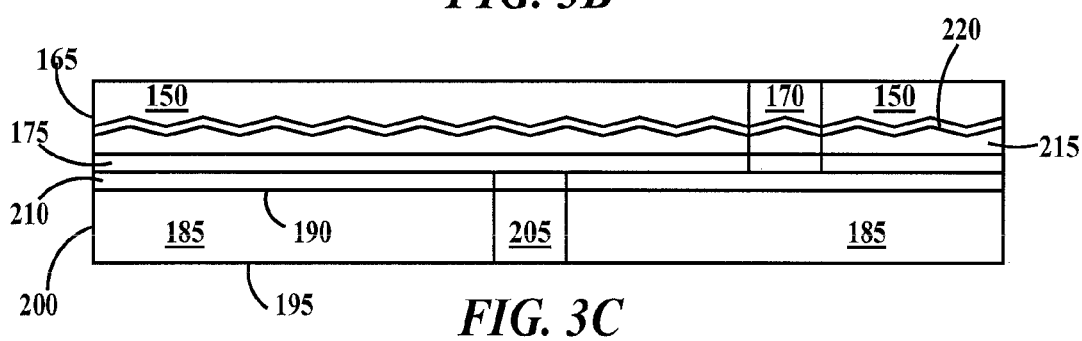

In FIG. 3C, wafers 150 and 185 (while in contact) are heated to a temperature of about 400° C. or greater Hydrogen rich layer 180 (see FIG. 3B) is brittle and an upper layer of wafer 150 is cleaved off leaving a silicon layer 215, having a rough top surface 220.

Figure 3D:
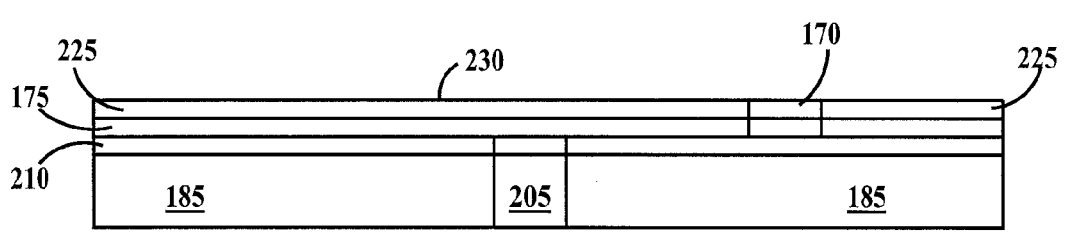
Figure 3E:
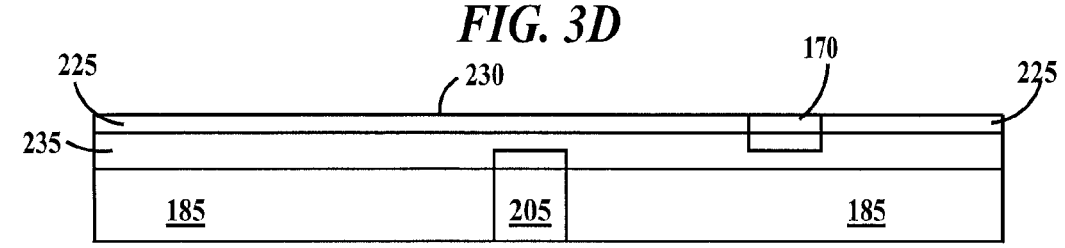

For many applications the remainder of wafer 150 still attached to wafer 185 is too thick and/or has too rough a surface and needs to be planarized and/or thinned. In FIG. 3D, a chemical mechanical polishing (CMP) process is performed to form a thin silicon layer 225 having a planer top surface 230. In one example, silicon layer 225 has a thickness between about 5 nm to about 100 nm In FIG. 3E, wafers 150 and 185 are heated, for example to about 1000° C. in hydrogen in order to merge oxide layers 175 and 210 (see FIG. 3D) into a silicon dioxide layer 235 which bonds the wafers together. In one example, silicon dioxide layer 235 has thickness between about 5 nm to about 500 nm. The structure illustrated in FIG. 3E is a silicon on insulator (SOI) substrate.

Figure 4:
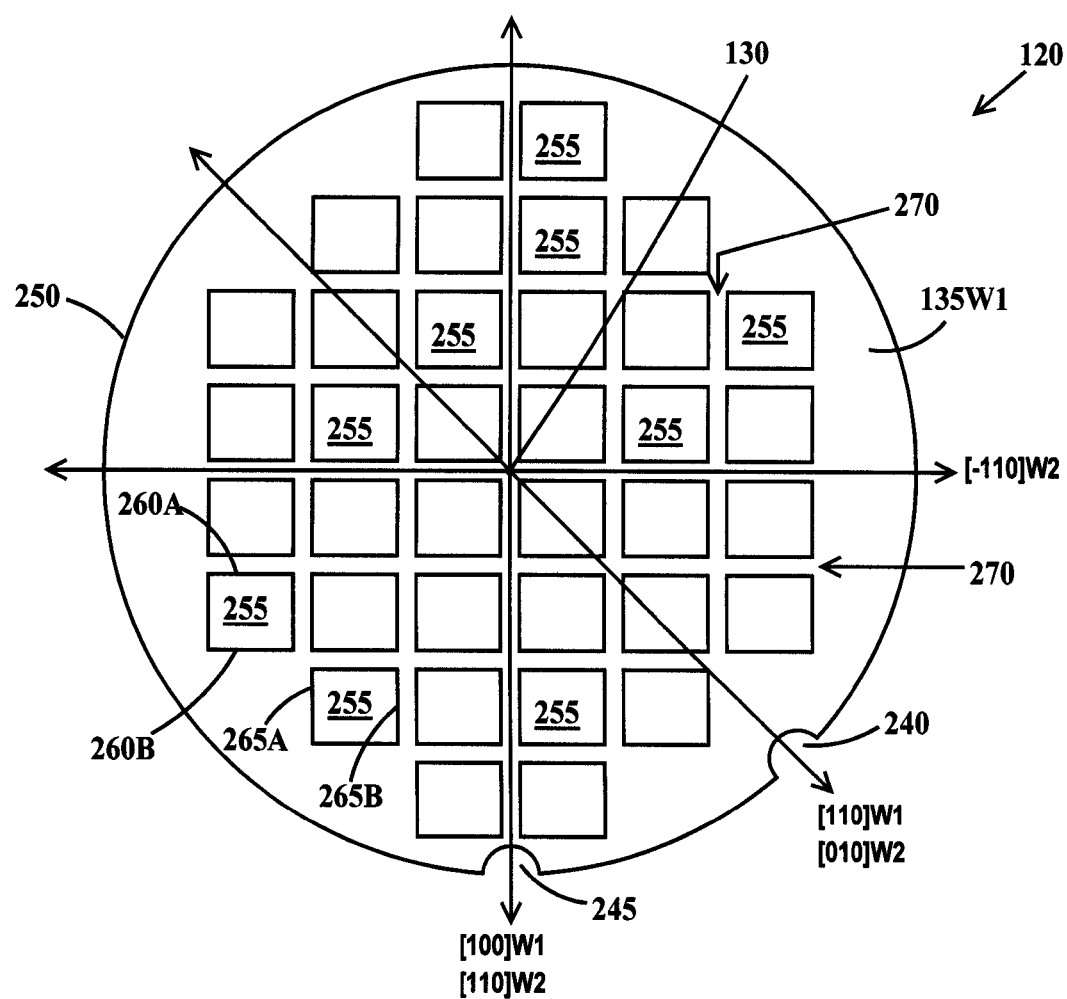
FIG. 4 is a top view illustrating alignment of integrated circuit chips on the semiconductor substrate of FIG. 2.

FIG. 4 is a top view illustrating alignment of integrated circuit chips on semiconductor substrate 120 of FIG. 2. In FIG. 4, substrate 120 has notches 240 and 245 formed in an edge 250 of the substrate. A line passing through central axis 130 and notch 240 locates the [110]W1 and [010] W2 crystal directions which are co-aligned. A line passing through central axis 130 and notch 245 locates the [100]W1 and [110]W2 crystal directions which are co-aligned. A multiplicity of integrated circuit chips 255 are formed on top surface 135W1. A first set of parallel edges 260A and 260B of integrated circuit chips 255 are parallel to crystal direction [−110]W2, a second set of parallel edges 265A and 265B of integrated circuit chips 255 are parallel to crystal direction [110]W2 (and crystal direction [100]W1). Spaces 270 between integrated circuit chips 255 form a dicing kerf where a dicing saw will cut substrate 120 to separate individual integrated circuit chips.

Figure 5:
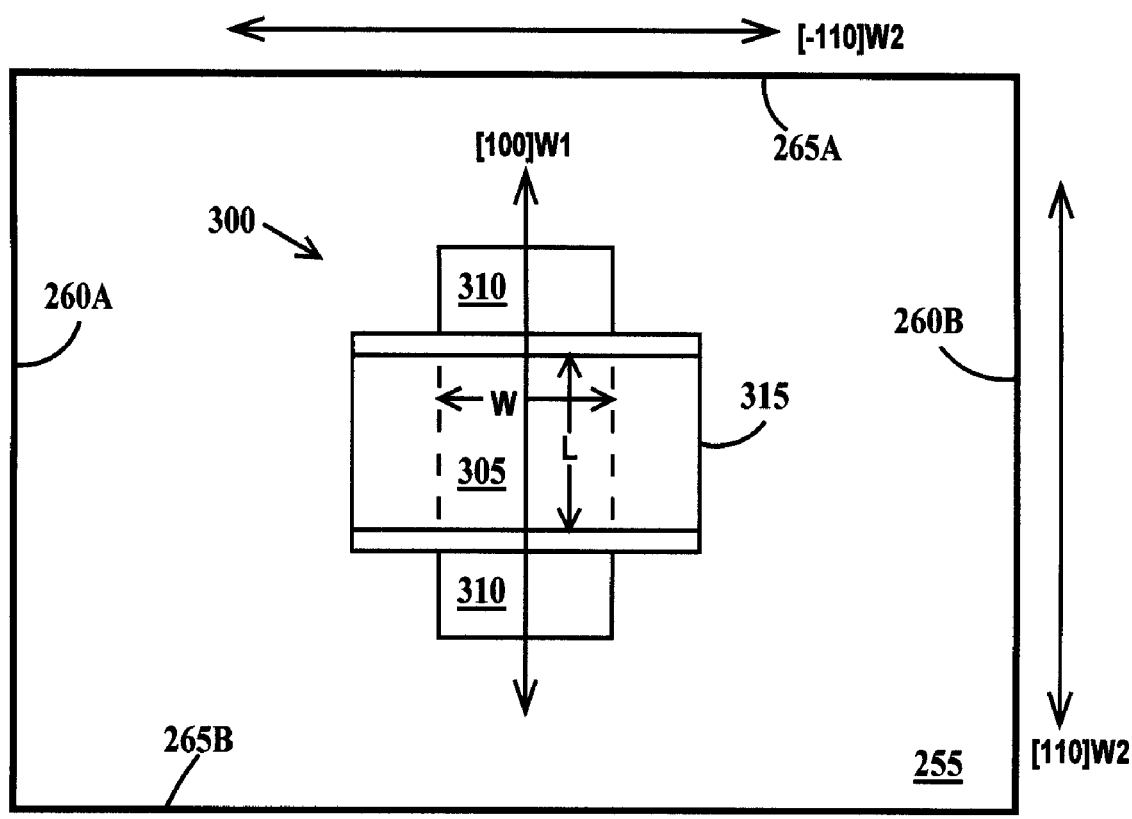
FIG. 5 is a top view illustrating alignment of a first type of device to an integrated circuit chip fabricated on a semiconductor substrate according to the present invention.

It should be noted that the dicing kerf is aligned with lower silicon layer 100W2 (see FIG. 2) which is the thicker layer of substrate 120 (see description supra) and the preferred cleavage planes of the lower silicon layer, while critical structures of devices formed in integrated circuit chips 255 may be printed aligned to crystal direction [100] W1 and still be aligned with edges 260A and 260B as illustrated in FIG. 5 described infra.

FIG. 5 is a top view illustrating alignment of a first type of device to an integrated circuit chip fabricated on a semiconductor substrate according to the present invention. In FIG. 5, a complementary metal oxide silicon (CMOS) PFET 300 comprises a silicon channel region 305 and source/drain regions 310 formed in silicon layer 100W1 (see FIG. 2) and a gate 315 formed over channel region 305. A gate dielectric (not shown) is formed under gate 315. Channel region 305 has a length "L" measured between source/drain regions 310 and a width "W" perpendicular to the channel length. Edges 265A and 265B are aligned with the [−110]W2 crystal direction and edges 270A and 270B are aligned with the [110]W2 crystal direction providing improved dicing characteristics. The length "L" of channel region 305 is aligned with the [100]W1 crystal direction, which provides maximum inversion carrier mobility for a PFET as well as with edges 260A and 260B. Improved printability of images during fabrication of PFET 300 and maximum device density of devices result as well.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, locating flats instead of locating notches or combinations of locating notches and locating flats may be used to locate the crystal directions. Therefore, it is intended that the following claims cover all such modifications and changes as fall within the true spirit and scope of the invention.

What is claimed is:

1. A substrate, comprising:
a first crystalline semiconductor layer and a second crystalline semiconductor layer; and
an insulating layer bonding a bottom surface of said first crystalline semiconductor layer to a top surface of said second crystalline semiconductor layer, a first crystal direction of said first crystalline semiconductor layer aligned relative to a second crystal direction of said second crystalline semiconductor layer, said first crystal direction different from said second crystal direction;
a first notch formed in an edge of said first crystalline semiconductor layer at an intersection of a line along said first crystal direction and passing through a center of said first crystalline semiconductor layer and a perimeter of said first crystalline semiconductor layer;
a second notch formed in an edge of said second crystalline semiconductor layer at an intersection of a line along said second crystal direction and passing through a center of said second crystalline semiconductor layer and a perimeter of said second crystalline semiconductor layer, and
wherein said first crystalline semiconductor layer has a thickness of between about 10 nm to about 100 nm, said insulating layer has a thickness of between about 5 nm to about 500 nm and said second crystalline semiconductor layer has a thickness of greater than about 700 microns.

2. The substrate of claim 1, wherein said first and second crystalline semiconductor layers each comprise silicon.

3. The substrate of claim 1, wherein said first and second crystal directions are co-aligned.

4. The substrate of claim 3, wherein first and second crystalline semiconductors each comprise {100} silicon and said first crystal direction is a [100] direction and said second crystal direction is a [110] direction.

5. The substrate of claim 1, wherein inversion carriers have a higher mobility in said first crystal direction than any other direction in said first crystalline semiconductor layer and a crystal plane perpendicular to said second crystal direction is more easily cleaved than any other crystal plane perpendicular to any other crystal direction in said second crystalline semiconductor layer.

6. The substrate of claim 1, wherein said insulating layer comprises silicon oxide.

7. The substrate of claim 1, wherein said first crystalline semiconductor layer has a thickness of less than about 20 nm.

8. The substrate of claim 1, wherein said insulating layer has a thickness of less than about 140 nm.

9. The substrate of claim 1, wherein said first and second crystalline semiconductor layers independently comprise GaAs, GaP, GaSb, InP, InAs or InSb.

10. The substrate of claim 1, wherein said first crystalline semiconductor layer comprise GaAs, GaP, GaSb, InP, InAs or InSb and said second crystalline semiconductor layer comprises silicon.

11. A substrate comprising:
a first crystalline semiconductor layer and a second crystalline semiconductor layer; and
an insulating layer bonding a bottom surface of said first crystalline semiconductor layer to a top surface of said second crystalline semiconductor layer, a first crystal direction of said first crystalline semiconductor layer aligned relative to a second crystal direction of said second crystalline semiconductor layer, said first crystal direction different from said second crystal direction;

a first notch formed in an edge of said first crystalline semiconductor layer at an intersection of a line along said first crystal direction and passing through a center of said first crystalline semiconductor layer and a perimeter of said first crystalline semiconductor layer; and a second notch formed in an edge of said second crystalline semiconductor layer at an intersection of a line along said second crystal direction and passing through a center of said second crystalline semiconductor layer and a perimeter of said second crystalline semiconductor layer.

* * * * *